United States Patent
Tao et al.

(10) Patent No.: US 11,574,759 B2
(45) Date of Patent: Feb. 7, 2023

(54) DEVICE FOR EVALUATING AND DEMAGNETIZING RESIDUAL MAGNETISM QUANTITY OF POWER TRANSFORMER AND CONTROL METHOD THEREOF

(71) Applicants: State Grid Jiangsu Electric Power Co., Ltd. Research Institute, Jiangsu (CN); Jiangsu Electric Power Research Institute Corporation Limited, Jiangsu (CN); State Grid Jiangsu Electric Power Co., Ltd., Jiangsu (CN); Nanjing DNN Technology Co., LTD, Jiangsu (CN)

(72) Inventors: Fengbo Tao, Jiangsu (CN); Jiansheng Li, Jiangsu (CN); Chao Wei, Jiangsu (CN); Yang Liu, Jiangsu (CN); Xu Wei, Jiangsu (CN); Yuncai Lu, Jiangsu (CN); Shu Chen, Jiangsu (CN); Hairong Wei, Jiangsu (CN); Yiming Wu, Jiangsu (CN); Xiaoping Yang, Jiangsu (CN); Jieqing Deng, Jiangsu (CN); Peng Wu, Tiangsu (CN); Tianxi Xie, Tiangsu (CN); Shengquan Wang, Tiangsu (CN); Caibo Liao, Jiangsu (CN); Ruibin Li, Jiangsu (CN)

(73) Assignees: State Grid Jiangsu Electric Power Co., Ltd. Research Institute, Jiangsu (CN); Jiangsu Electric Power Research Institute Corporation Limited, Jiangsu (CN); State Grid Jiangsu Electric Power Co., Ltd., Jiangsu (CN); Nanjing DNN Technology Co., LTD, Jiangsu (CN)

(*) Notice: Subject to any disclaimer, the term of this patent is extended or adjusted under 35 U.S.C. 154(b) by 824 days.

(21) Appl. No.: 16/528,597

(22) Filed: Jul. 31, 2019

(65) Prior Publication Data
US 2020/0126706 A1 Apr. 23, 2020

(51) Int. Cl.
*G01R 33/12* (2006.01)
*H01F 13/00* (2006.01)
*H01F 27/42* (2006.01)

(52) U.S. Cl.
CPC .......... *H01F 13/006* (2013.01); *G01R 33/12* (2013.01); *H01F 27/42* (2013.01)

(58) Field of Classification Search
CPC ........ H01F 13/006; H01F 27/42; G01R 33/12
See application file for complete search history.

(56) References Cited

U.S. PATENT DOCUMENTS

| 4,456,875 A | * | 6/1984 | Chenier | G01R 31/00 324/726 |
| 2002/0109507 A1 | * | 8/2002 | Khalin | G01R 31/62 324/547 |
| 2007/0115603 A1 | * | 5/2007 | Maurer | H01F 13/006 361/149 |

* cited by examiner

*Primary Examiner* — Jermele M Hollington
*Assistant Examiner* — Taqi R Nasir
(74) *Attorney, Agent, or Firm* — JCIP Global Inc.

(57) ABSTRACT

The present invention discloses a device for evaluating and demagnetizing residual magnetism quantity of a power transformer. A main circuit comprises a switching power supply the two ends of which are respectively connected with a filter capacitor and a resistor in parallel. A forward end of the switching power supply is connected with a main switch in series. A rear end of the main switch is connected with a series branch of a sixth switch and a first resistor, a series branch of a first switch and a second switch, and a series branch of a third switch and a fourth switch are connected in parallel. A driving circuit is respectively connected with driving ends of the main switch, the sixth, first, second, third and fourth switches. A control circuit is connected with the driving circuit for sending an instruction to the driving circuit.

19 Claims, 5 Drawing Sheets

DEVICE FOR EVALUATING AND DEMAGNETIZING RESIDUAL MAGNETISM QUANTITY OF POWER TRANSFORMER AND CONTROL METHOD THEREOF

CROSS-REFERENCE TO RELATED APPLICATION

This application claims the priority benefit of China application serial no. 201811227394.9, filed on Oct. 22, 2018. The entirety of the above-mentioned patent application is hereby incorporated by reference herein and made a part of this specification.

TECHNICAL FIELD

The present invention relates to a device for evaluating and demagnetizing residual magnetism quantity of a power transformer and a control method thereof, and belongs to the field of power system safety control technologies.

BACKGROUND

Residual magnetism may be generated after existed operation of a power transformer and DC resistance test, and the residual magnetism quantity depends on a current in a winding before operation of a switch, and a strength and a time of a DC current passing through the winding. The influence of residual magnetism of a transformer core mainly includes the following aspects.

(1) When the residual magnetism quantity of the transformer is large, a magnetizing inrush current generated by no-load charging may lead to a large difference between input and output currents of the transformer, thus causing mis-operation of differential protection of the transformer.

(2) Impact magnetizing inrush current formed during no-load charging of the transformer may cause mechanical force between the windings, which may gradually loosen a fixture and deform the winding, thus causing hidden dangers.

(3) The magnetizing inrush current contains various harmonic components and DC components, which makes the transformer a harmonic source in a power grid and reduces the power supply quality of a power supply system; and meanwhile, a higher-order component in a harmonic wave may also have a strong destructive effect on a sensitive power electronic component in the power system.

Therefore, evaluation and demagnetization to the residual magnetism quantity of the power transformer before it is put into operation have great significance for safe operation of the transformer and stable operation of the power grid. At present, there is no effective residual magnetism evaluation method for the residual magnetism quantity of the power transformer. This makes demagnetization blind. The existing demagnetization methods include AC demagnetization and DC demagnetization. The AC demagnetization method requires complicated device and large capacity, which is generally difficult to be realized on site; and the DC demagnetization method is to supply a direct current with alternating direction and gradually decreased amplitude to two ends of a high-voltage winding, thus achieving the purpose of eliminating residual magnetism. However, it is difficult to reflect the change of the residual magnetism quantity in an actual demagnetization process, and the demagnetization effect cannot be guaranteed.

SUMMARY

Object: in order to overcome the defects in the prior art, the present invention provides a device for evaluating and demagnetizing residual magnetism quantity of a power transformer and a control method thereof.

Technical solution: in order to solve the technical problems above, the following technical solution is employed in the present invention.

A device for evaluating and demagnetizing residual magnetism quantity of a power transformer comprises a main circuit, a control circuit and a driving circuit, wherein the main circuit comprises a switching power supply the two ends of which are respectively connected with a filter capacitor and a resistor R0 in parallel, a forward end of the switching power supply is connected with a main switch T5 in series, and a rear end of the main switch T5 is connected with a series branch of a sixth switch T6 and a first resistor R1, a series branch of a first switch T1 and a second switch T2, and a series branch of a third switch T3 and a fourth switch T4 in parallel; and the driving circuit is respectively connected with driving ends of the main switch T5, the sixth switch T6, the first switch T1, the second switch T2, the third switch T3 and the fourth switch T4, and the control circuit is connected with the driving circuit for sending an instruction to the driving circuit.

As a preferred solution, the rear end of the main switch T5 is also connected with a series branch of a seventh switch T7 and a second resistor R2 in parallel, and the driving circuit is connected with a driving end of the seventh switch T7.

As a preferred solution, a resistance value of the second resistor R2 is greater than that of the first resistor R1.

As a preferred solution, the control circuit comprises a residual magnetism quantity evaluation control module, and the residual magnetism quantity evaluation control module is configured to switch on the first switch T1, the fourth switch T4 and the main switch T5, switch off the second switch T2, the third switch T3, the sixth switch T6 and the seventh switch T7, forwardly charge a winding to be tested which is accessed to two common ends between the first switch T1 and the second switch T2, as well as between the third switch T3 and the fourth switch T4, record a real-time first current value N1 of the winding to be tested, and finish recording when the first current value N1 rises to a predetermined current value; switch on the sixth switch T6 firstly, then switch off the first switch T1, the fourth switch T4 and the main switch T5 in sequence until the current in the winding to be tested is 0 A; switch off the sixth switch T6, switch on the second switch T2, the third switch T3 and the main switch T5, reversely charge the winding to be tested, record a second real-time current value N2 of the winding to be tested, and finish recording when the second current value N2 rises to a predetermined current value; switch on the sixth switch T6 firstly, then switch off the second switch T2, the third switch T3 and the main switch T5 in sequence until the current in the winding to be tested is 0 A; calculate a correlation coefficient ρ of the real-time first and second current values N1 and N2; and evaluate ρ'=1−ρ, wherein ρ' is a residual magnetism evaluation value, the less the ρ' value is, the less the residual magnetism is, and the larger the value is, the more the residual magnetism is.

As a preferred solution, the control circuit comprises a residual magnetism quantity demagnetization control module, wherein the residual magnetism quantity demagnetization control module is configured to switch on the first switch T1, the fourth switch T4 and the main switch T5, switch off the second switch T2, the third switch T3, the sixth switch T6 and the seventh switch T7, forwardly charge a winding to be tested which is accessed to two common ends between the first switch T1 and the second switch T2, as well as between the third switch T3 and the fourth switch T4, switch on the sixth switch T6 firstly when a current value of the winding to be tested reaches a first given demagnetization current value, then switch off the first switch T1, the fourth switch T4 and the main switch T5 in sequence, and forwardly discharge until the current in the winding to be tested is 0 A; switch off the sixth switch T6, switch on the second switch T2, the third switch T3 and the main switch T5, reversely charge the winding to be tested, switch on the sixth switch T6 firstly when the current value of the winding to be tested reaches a second given demagnetization current value, then switch off the second switch T2, the third switch T3 and the main switch T5 in sequence, and reversely discharge until the current in the winding to be tested is 0 A, wherein the second given demagnetization current value is less than the first given demagnetization current value, and a reduction amount of the second given demagnetization current value is 3% to 5% of the first given demagnetization current value; repeat the step 2 to forwardly charge and forwardly discharge the winding to be tested to 0 A, wherein a third given demagnetization current value is less than the second given demagnetization current value, and a reduction amount of the third given demagnetization current value is 3% to 5% of the second given demagnetization current value; repeat the step 3 to reversely charge and reversely discharge the winding to be tested to 0 A, wherein a fourth given demagnetization current value is less than the third given demagnetization current value, and a reduction amount of the fourth given demagnetization current value is 3% to 5% of the third given demagnetization current value; repeat the steps 2 to 5 to forwardly charge and forwardly discharge the winding to be tested to 0 A for an $N^{th}$ times, or reversely charge and reversely discharge the winding to be tested to 0 A for the $N^{th}$ times, wherein an $N^{th}$ given demagnetization current value is less than an $(N-1)^{th}$ given demagnetization current value, a reduction amount of the $N^{th}$ given demagnetization current value is 3% to 5% of the $(N-1)^{th}$ given demagnetization current value, and N is a natural number; and finish demagnetizing until the $N^{th}$ given demagnetization current value falls into an interval of [10 mA to 20 mA].

As a preferred solution, the residual magnetism quantity demagnetization control module is further configured to collect a real-time current value i of the winding to be tested and a real-time voltage value u at two ends in the step 2 to step 6, calculate a real-time magnetic flux variation of the winding to be tested according to a formula $\Delta\Phi = \int_{t_0}^{t_1} udt$, and drawing a hysteresis loop with the real-time magnetic flux variation as a vertical axis and the corresponding real-time current value i as a horizontal axis.

Beneficial effect: the device for evaluating and demagnetizing residual magnetism quantity of a power transformer and the control method thereof provided by the present invention provides reference basis for realizing accurate and rapid demagnetization, is more intelligent, can realize rapid and complete demagnetization, and greatly improves a demagnetizing time and a demagnetizing effect on site.

DETAILED DESCRIPTION

The present invention is further described below with reference to the drawings.

Figure 1:
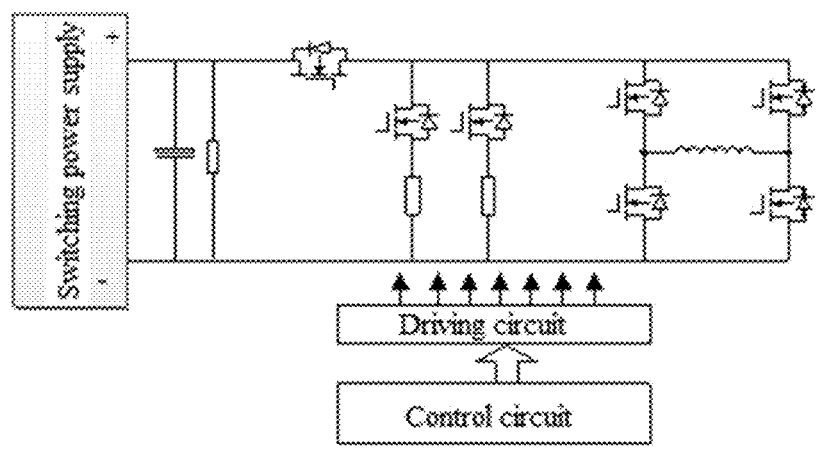
FIG. 1 is a structure diagram of a device for evaluating and demagnetizing residual magnetism quantity of a power transformer.
Figure 2:
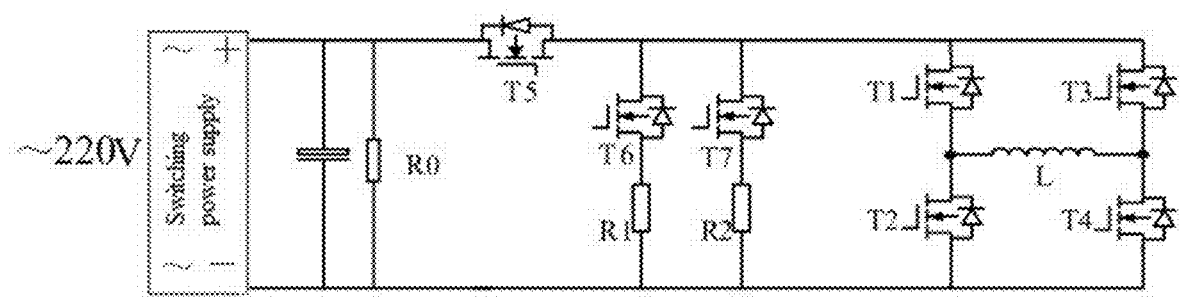
FIG. 2 is a structure diagram of a main circuit.

As shown in FIGS. 1 to 2, a device for evaluating and demagnetizing residual magnetism quantity of a power transformer comprises a main circuit, a control circuit and a driving circuit, wherein the main circuit comprises a switching power supply the two ends of which are respectively connected with a filter capacitor and a resistor R0 in parallel, a forward end of the switching power supply is connected with a main switch T5 in series, and a rear end of the main switch T5 is connected with a series branch of a sixth switch T6 and a first resistor R1, a series branch of a first switch T1 and a second switch T2, and a series branch of a third switch T3 and a fourth switch T4 in parallel; and the driving circuit is respectively connected with driving ends of the main switch T5, the sixth switch T6, the first switch T1, the second switch T2, the third switch T3 and the fourth switch T4, and the control circuit is connected with the driving circuit for sending an instruction to the driving circuit.

A residual magnetism quantity evaluation control method of the device for evaluating and demagnetizing residual magnetism quantity of a power transformer comprises the following steps.

Step 1: respectively access two ends of a winding to be tested of the transformer to two common ends between the first switch T1 and the second switch T2, as well as between the third switch T3 and the fourth switch T4.

Figure 3:
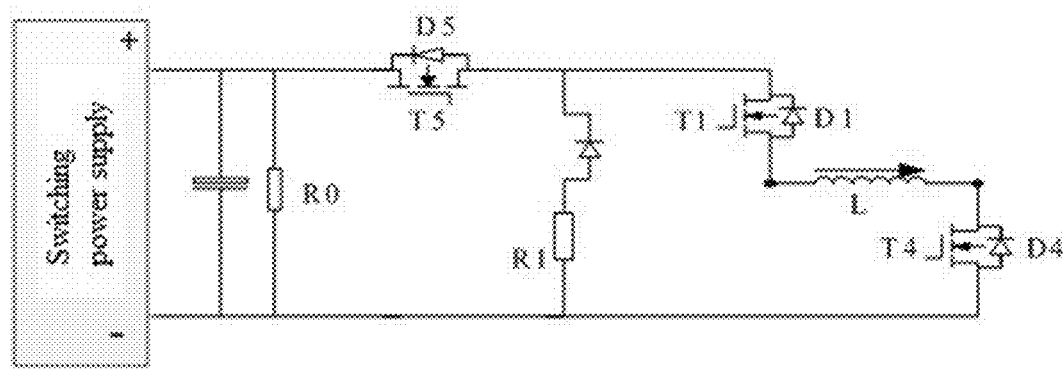
FIG. 3 is an equivalent circuit diagram illustrating forward charging of the main circuit.

As shown in FIG. 3, step 2: switch on the first switch T1, the fourth switch T4 and the main switch T5, switch off the second switch T2, the third switch T3, the sixth switch T6 and the seventh switch T7, forwardly charge the winding to be tested, record a real-time first current value N1 of the winding to be tested, and finish recording when the first current value N1 rises to a predetermined current value.

Figure 4:
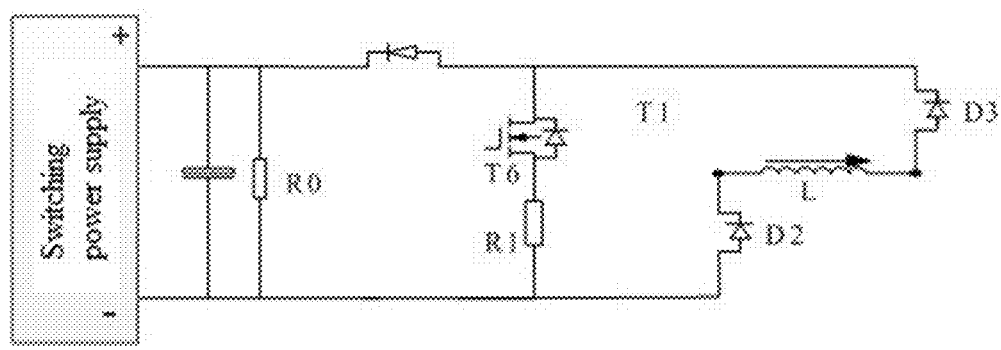
FIG. 4 is an equivalent circuit diagram illustrating forward discharging of the main circuit.

As shown in FIG. 4, step 3: switch on the sixth switch T6 firstly, then switch off the first switch T1, the fourth switch T4 and the main switch T5 in sequence, and forwardly discharge the current in the winding to be tested through a discharge loop formed by a second freewheel diode D2, a third freewheel diode D3, the sixth switch T6 and the first resistor R1 until the current in the winding to be tested is 0 A.

Figure 5:
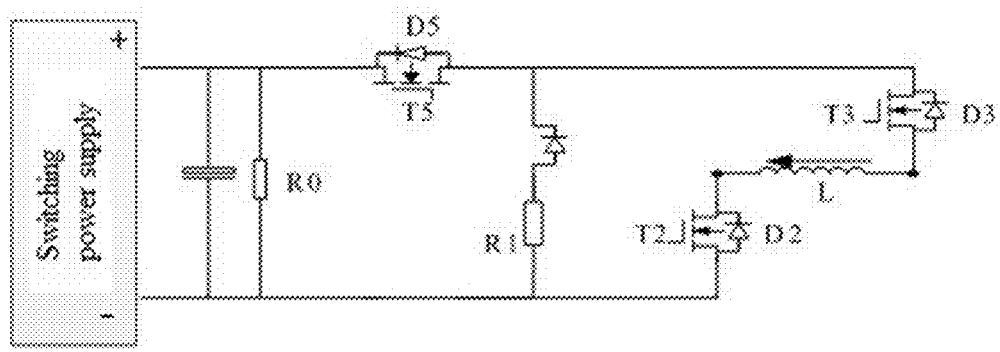
FIG. 5 is an equivalent circuit diagram illustrating reverse charging of the main circuit.

As shown in FIG. 5, step 4: switch off the sixth switch T6, switch on the second switch T2, the third switch T3 and the main switch T5, reversely charge the winding to be tested, record a second real-time current value N2 of the winding to be tested, and finish recording when the second current value N2 rises to a predetermined current value.

Figure 6:
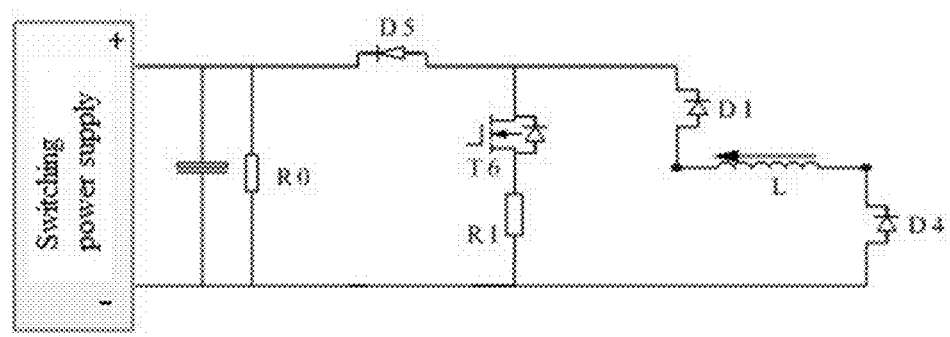
FIG. 6 is an equivalent circuit diagram illustrating reverse discharging of the main circuit.

As shown in FIG. 6, step 5: switch on the sixth switch T6 firstly, then switch off the second switch T2, the third switch T3 and the main switch T5 in sequence, and reversely discharge the current in the winding to be tested through a discharge loop formed by a first freewheel diode D1, a fourth freewheel diode D4, the sixth switch T6 and the first resistor R1 until the current in the winding to be tested is 0 A.

Step 6: calculate a correlation coefficient ρ of the real-time first and second current values N1 and N2.

Step 7: evaluate ρ'=1−ρ, wherein ρ' is a residual magnetism evaluation value, the less the ρ' value is, the less the residual magnetism is, and the larger the value is, the more the residual magnetism is.

A calculation formula of the correlation coefficient ρ is as follows:

$$\rho = Cov(N1,N2)/\sigma N1 * \sigma N2$$

wherein, σN1 is a standard deviation of N1, σN2 is a standard deviation of N2, and Cov(N1,N2)=EN1N2−EN1*EN2. EN1 and EN2 are respectively mathematical expectations of variables N1 and N2, and EN1N2 is a mathematical expectation of N1N2.

A relationship between a value of the correlation coefficient ρ and the residual magnetism quantity of the transformer is as follows: if the transformer has no residual magnetism, forward and reverse charging current values corresponding to each moment of the transformer are the same in the same charging time, and from a waveform point of view, forward and reverse charging current waveforms are coincident in the same charging time, with high correlation; and if the transformer has the residual magnetism, the forward and reverse charging current values corresponding to each moment of the transformer are different in the same charging time, and from the waveform point of view, the forward and reverse charging current waveforms are not coincident in the same charging time, with low correlation.

Therefore, when the transformer is under the no-magnetism state, a correlation between forward and reverse charging current values is high, and the calculated correlation coefficient is close to 1; and when the transformer is under a full-magnetism state, the correlation between the forward and reverse charging current values is low, and the correlation coefficient is close to 0. In order to visually represent non-magnetism, magnetism and full-magnetism data, 1−ρ is used to represent the residual magnetism quantity; at the moment, the corresponding residual magnetism quantity is 0 under the no-magnetism state, the residual magnetism quantity is recorded as 1 under the full-magnetism state, and the residual magnetism quantity is between 0 And 1 under the magnetism state. That is, the less the value is, the less the residual magnetism is, and the larger the value is, the more the residual magnetism is.

A residual magnetism quantity demagnetization control method of the device for evaluating and demagnetizing residual magnetism quantity of a power transformer comprises the following steps.

Step 1: respectively access two ends of the winding to be tested of the transformer to two common ends between the first switch T1 and the second switch T2, as well as the third switch T3 and the fourth switch T4.

Step 2: switch on the first switch T1, the fourth switch T4 and the main switch T5, switch off the second switch T2, the third switch T3, the sixth switch T6 and the seventh switch T7, forwardly charge the winding to be tested, switch on the sixth switch T6 firstly when a current value of the winding to be tested reaches a first given demagnetization current value, then switch off the first switch T1, the fourth switch T4 and the main switch T5 in sequence, and forwardly discharge until the current in the winding to be tested is 0 A.

Step 3: switch off the sixth switch T6, switch on the second switch T2, the third switch T3 and the main switch T5, reversely charge the winding to be tested, switch on the sixth switch T6 firstly when the current value of the winding to be tested reaches a second given demagnetization current value, then switch off the second switch T2, the third switch T3 and the main switch T5 in sequence, and reversely discharging until the current in the winding to be tested is 0 A; wherein the second given demagnetization current value is less than the first given demagnetization current value, and a reduction amount of the second given demagnetization current value is 3% to 5% of the first given demagnetization current value.

Step 4: repeat the step 2 to forwardly charge and forwardly discharge the winding to be tested to 0 A, wherein a third given demagnetization current value is less than the second given demagnetization current value, and a reduction amount of the third given demagnetization current value is 3% to 5% of the second given demagnetization current value.

Step 5: repeat the step 3 to reversely charge and reversely discharge the winding to be tested to 0 A, wherein a fourth given demagnetization current value is less than the third given demagnetization current value, and a reduction amount of the fourth given demagnetization current value is 3% to 5% of the third given demagnetization current value.

Step 6: repeat the steps 2 to 5 to forwardly charge and forwardly discharge the winding to be tested to 0 A for an $N^{th}$ times, or reversely charge and reversely discharge the winding to be tested to 0 A for the $N^{th}$ times, wherein an $N^{th}$ given demagnetization current value is less than an $(N-1)^{th}$ given demagnetization current value, a reduction amount of the $N^{th}$ given demagnetization current value is 3% to 5% of the $(N-1)^{th}$ given demagnetization current value, and N is a natural number; and finishing demagnetizing until the $N^{th}$ given demagnetization current value falls into an interval of [10 mA to 20 mA].

Figure 7:
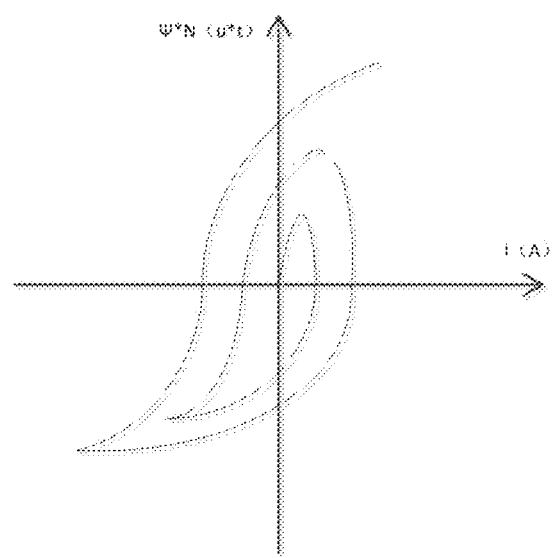
FIG. 7 is a diagram of a hysteresis loop.

As shown in FIG. 7, the method further comprises step 7: collect a real-time current value i of the winding to be tested and a real-time voltage value u at two ends in the step 2 to step 6, calculate a real-time magnetic flux variation of the winding to be tested according to a formula $\Delta\Phi = \int_{t_0}^{t_1} u \, dt$, and draw a hysteresis loop with the real-time magnetic flux variation as a vertical axis and the corresponding real-time current value i as a horizontal axis.

The hysteresis loop represents a closed magnetizing curve of a hysteresis phenomenon of a ferromagnetic substance when a magnetic field intensity is periodically changed, which shows a relationship between a magnetic induction intensity B and a magnetic field intensity H in a repeated magnetizing process of the ferromagnetic substance. When the current in the winding of the transformer is periodically changed during demagnetization, the magnetic induction intensity B and the magnetic field intensity H may show a curve diagram as shown in FIG. 7 due to the existence of the residual magnetism. The less the residual magnetism is, the smaller the hysteresis loop is, and when the hysteresis loop returns to the origin, the elimination of the residual magnetism is finished. Therefore, the residual magnetism quantity of the transformer may be reflected by drawing the hysteresis loop, and the demagnetization effect is tested.

First Embodiment

A switching power supply of a main circuit is 96V. T5 is a main switch. Main switch T5 is switched on when charging, and the main switch T5 is switched off when discharging. The sixth and seventh switches T6 and T7 are discharging switches. The sixth and seventh switches T6 and T7 are switched off when charging and switched on when discharging. A discharge resistance is selected corresponding to different current values to improve a discharge speed of a winding L to be tested (the sixth switch T6 is switched on when the current is larger than 1 A to discharge through the first resistor R1; and the seventh switch T7 is switched on when the current is less than 1 A to discharge through the first resistor R1 and the second resistor R2 simultaneously, so as to accelerate the discharge speed). The first switch T1 and the fourth switch T4 are forward charging switches, which are switched on when forwardly charging and switched off when discharging. The second switch T2 and the third switch T3 are reverse charging switches, which are switched on when reversely charging and switched off when discharging. A resistor R0 is a discharge resistor of a filter capacitor. Resistors R1 and R2 are discharge resistors of a winding of a transformer, wherein R2<R1; and L is the winding of the transformer.

The process of DC demagnetization of the transformer is: to circularly supply a bidirectional current which is gradually decreased to a one-phase winding of the transformer. For example, +5 A current is supplied to the transformer for the first time, and then the winding is discharged to 0 A; −4.7 A is supplied to the transformer for the second time, and then the winding is discharged to 0 A; +4.2 A is supplied to the transformer for the third time, and then the winding is discharged to 0 A; and −4 A is supplied to the transformer for the fourth time, and then the winding is discharged to 0 A, thus circulating in this way. The demagnetization is finished until the $N^{th}$ given demagnetization current value falls into an interval of [10 mA to 20 mA].

A magnetic balance current sensor is used in the present invention, which integrates a mutual inductor, a magnetic amplifier, a hall element and an electronic circuit, has the advantages of high precision, small zero drift, rapid response, strong anti-interference capability and the like, and can effectively electrically isolate a main circuit and a control circuit, thus ensuring high measurement precision in a full range of 10 mA to 5 A.

The design of a driving circuit is an important link to determine whether the main circuit can work normally, which is related to the working safety of the device and the performance of the whole circuit. The driving circuit consists of a driving module TLP250, TLP250 is simple in use and is rapid in switching response (a maximum switching response time is 1.5 μs). Optocoupler isolation is applied in the inside, which may directly drive a power module isolating low and medium powers. The driving circuit in the present invention is used for driving power tubes T1, T2, T3, T4, T5, T6 and T7. Each power tube has a driving circuit. Taking the power tube T6 as an example, if drive is high level, drive output G controls the connection of the power tube; and if drive is low level, the drive output G controls the disconnection of the power tube.

Test Result Analysis

In order to test the effectiveness of the residual magnetism evaluation method, a 220KVA autotransformer is selected for experiment. The existing condition is used to simulate a residual magnetism state of the transformer. Simulation of no-magnetism state: the transformer is demagnetized by a demagnetization device to make the transformer in the no-magnetism state. Simulation of magnetism state: under the no-magnetism state, the transformer is magnetized with 5 A current for 30 s to make the transformer in a magnetic state. Simulation of full-magnetism state: under the no-magnetism state, the transformer is magnetized with 5 A current for 24 h to make the transformer in a full-magnetism state.

Under various residual magnetism states, the residual magnetism of the transformer is pre-evaluated by the residual magnetism evaluation method of the present invention, and the experimental result is shown in Table 1. It can be known from Table 1 that the residual magnetism evaluation result of transformer under different residual magnetism states are obviously different. The evaluation result conforms to a theoretical value. That is, the 1-correlation coefficient of the residual magnetism evaluation of the transformer is close to 0 under the no-magnetism state; the 1-correlation coefficient of the residual magnetism evaluation is close to 1 under the full-magnetism state; therefore, it can be known that the method is effective to evaluate the residual magnetism of the transformer.

TABLE 1

| Residual magnetism state | Charging current | 1-correlation coefficient |
| --- | --- | --- |
| No magnetism | 5 A | $0.5647 * 10^{-4}$ |
| Magnetism | 5 A | 0.3142 |
| Full magnetism | 5 A | 0.9818 |

Figure 8:
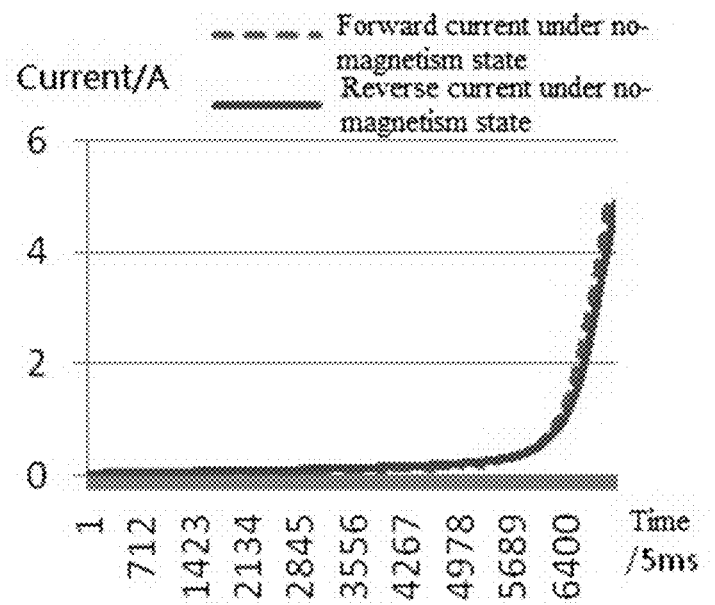
FIG. 8 is a forward and reverse current waveform of the embodiment under a no-magnetism state.
Figure 9:
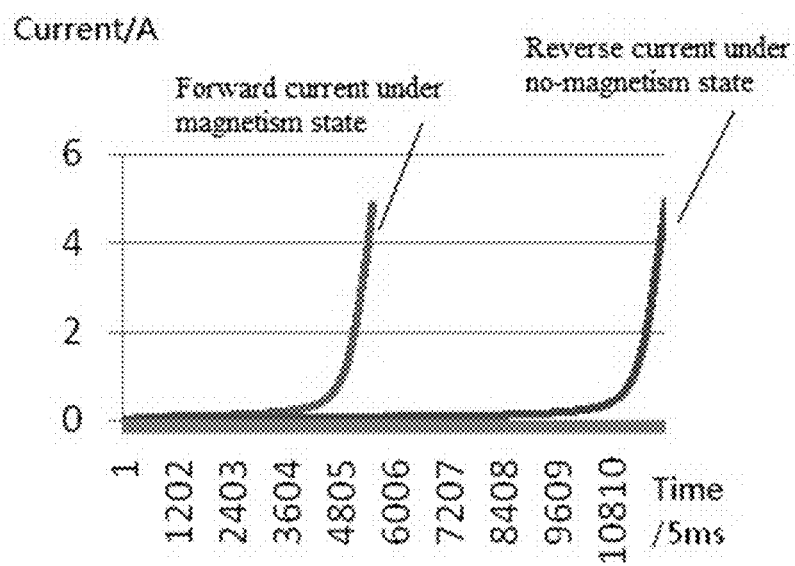
FIG. 9 is a forward and reverse current waveform of the embodiment under a magnetism state.
Figure 10:
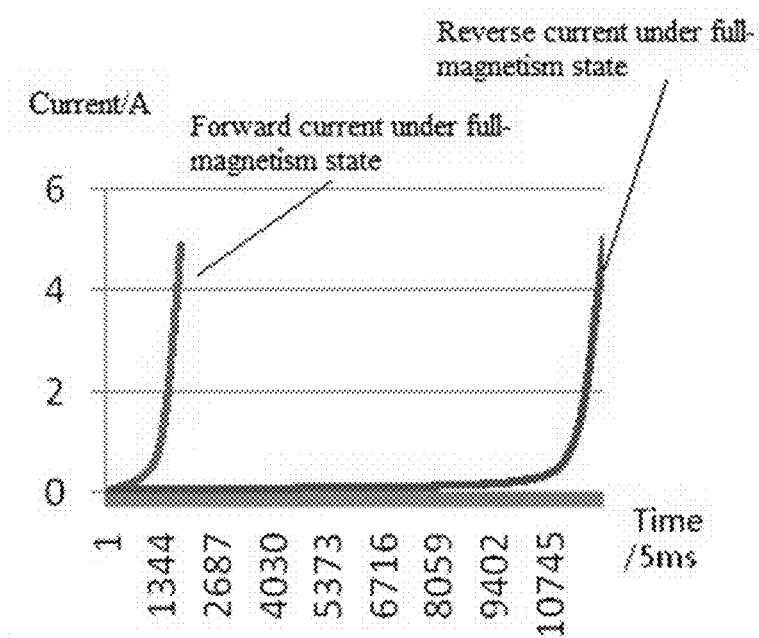
FIG. 10 is a forward and reverse current waveform of the embodiment under a full-magnetism state.

The effectiveness of the judgment method is further illustrated by combining an experimental waveform. FIG. 8, FIG. 9, and FIG. 10 are forward and reverse current waveforms for the residual magnetism evaluation of the winding of the transformer under a no-magnetism state, a magnetism state, and a full-magnetism state respectively. The differences among the diagrams of the current waveforms of the winding of the transformer under the no-magnetism state, the magnetism state, and the full-magnetism state can be seen clearly. Under the no-magnetism state, the forward and reverse charging curves are almost coincident, and the correlation is high. Under the magnetism state, the forward and reverse charging curves are not coincident. Under the full-magnetism state, the forward and reverse charging curves are not coincident, the spacing is the largest, and the correlation is low. The differences are corresponding to the 1-correlation coefficient of forward and reverse current values of the transformer under different residual magnetism states. That is, the higher the coincidence degree of the waveform is, the less the value of 1-correlation coefficient is. This verifies the effectiveness of the residual magnetism evaluation method proposed herein.

Figure 11:
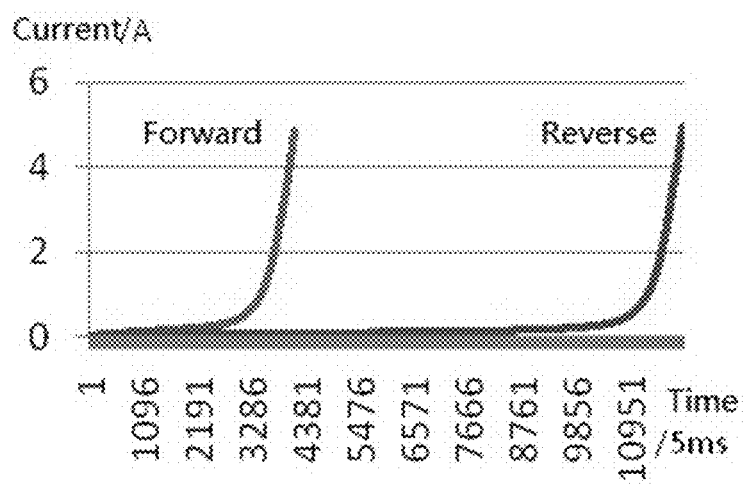
FIG. 11 is a forward and reverse current waveform of the embodiment.

In order to test the effectiveness of the demagnetization method of the present invention, a 220KVA power transformer is selected for testing. Firstly, the winding at a high voltage side of the transformer is forwardly and reversely charged to collect current values. The current waveform is drawn as FIG. 11. It can be known from the figure that the transformer is under a magnetism state, and the 1-correlation coefficient is calculated to be 0.41 according to the forward and reverse current values. The transformer is considered to have 41% residual magnetism.

Regarding to the data analysis above, 1 A current is selected for demagnetization, a change amount of magnetic flux in each charging and discharging period is calculated at the same time, and the hysteresis loop diagram is drawn. It can be known from the diagram analysis that the residual magnetism quantity is less and less after repeated forward and reverse charging, and the residual magnetism is eliminated. The expected effect is achieved, which shows that the demagnetization method is effective and reliable.

The above are merely the preferred embodiments of the present invention, and it should be noted that those of ordinary skills in the art may further make a plurality of improvements and decorations without departing from the principle of the present invention, and these improvements and decorations shall also fall within the protection scope of the present invention.

What is claimed is:

1. A device for evaluating and demagnetizing residual magnetism quantity of a power transformer, comprising a main circuit, a control circuit and a driving circuit, wherein the main circuit comprises a switching power supply the two ends of which are respectively connected with a filter capacitor and a resistor in parallel, a forward end of the switching power supply is connected with a main switch in series, and a rear end of the main switch is connected with a series branch of a sixth switch and a first resistor, a series branch of a first switch and a second switch, and a series branch of a third switch and a fourth switch in parallel; and the driving circuit is respectively connected with driving ends of the main switch, the sixth switch, the first switch, the second switch, the third switch and the fourth switch, and the control circuit is connected with the driving circuit for sending an instruction to the driving circuit.

2. The device for evaluating and demagnetizing residual magnetism quantity of a power transformer according to claim 1, wherein the rear end of the main switch is also connected with a series branch of a seventh switch and a second resistor in parallel, and the driving circuit is connected with a driving end of the seventh switch.

3. The device for evaluating and demagnetizing residual magnetism quantity of a power transformer according to claim 2, wherein a resistance value of the second resistor is greater than that of the first resistor.

4. The device for evaluating and demagnetizing residual magnetism quantity of a power transformer according to claim 1, wherein the control circuit comprises a residual magnetism quantity evaluation control module, and the residual magnetism quantity evaluation control module is configured to switch on the first switch, the fourth switch and the main switch, switch off the second switch, the third switch, the sixth switch and the seventh switch, forwardly charge a winding to be tested which is accessed to two common ends between the first switch and the second switch, as well as between the third switch and the fourth switch, record a real-time first current value of the winding to be tested, and finish recording when the first current value rises to a predetermined current value; switch on the sixth switch firstly, then switch off the first switch, the fourth switch and the main switch in sequence until the current in the winding to be tested is 0 A; switch off the sixth switch, switch on the second switch, the third switch and the main switch, reversely charge the winding to be tested, record a real-time second current value of the winding to be tested, and finish recording when the second current value rises to a predetermined current value; switch on the sixth switch firstly, then switch off the second switch, the third switch and the main switch in sequence until the current in the winding to be tested is 0 A; calculate a correlation coefficient ρ of the first and second real-time current values; and evaluate ρ'=1−ρ, wherein ρ' is a residual magnetism evaluation value, the less the ρ' value is, the less the residual magnetism is, and the larger the value is, the more the residual magnetism is.

5. The device for evaluating and demagnetizing residual magnetism quantity of a power transformer according to claim 1, wherein the control circuit comprises a residual magnetism quantity demagnetization control module, wherein the residual magnetism quantity demagnetization control module is configured to switch on the first switch, the fourth switch and the main switch, switch off the second switch, the third switch, the sixth switch and the seventh switch, forwardly charge a winding to be tested which is accessed to two common ends between the first switch and the second switch, as well as between the third switch and the fourth switch, switch on the sixth switch firstly when a current value of the winding to be tested reaches a first given demagnetization current value, then switch off the first switch, the fourth switch and the main switch in sequence, and forwardly discharge until the current in the winding to be tested is 0 A; switch off the sixth switch, switch on the second switch, the third switch and the main switch, reversely charge the winding to be tested, switch on the sixth switch firstly when the current value of the winding to be tested reaches a second given demagnetization current value, then switch off the second switch, the third switch and the main switch in sequence, and reversely discharge until the current in the winding to be tested is 0 A, wherein the second given demagnetization current value is less than the first given demagnetization current value, and a reduction amount of the second given demagnetization current value is 3% to 5% of the first given demagnetization current value; repeat the step 2 to forwardly charge and forwardly discharge the winding to be tested to 0 A, wherein a third given demagnetization current value is less than the second given demagnetization current value, and a reduction amount of the third given demagnetization current value is 3% to 5% of the second given demagnetization current value; repeat the step 3 to reversely charge and reversely discharge the winding to be tested to 0 A, wherein a fourth given demagnetization current value is less than the third given demagnetization current value, and a reduction amount of the fourth given demagnetization current value is 3% to 5% of the third given demagnetization current value; repeat the steps 2 to 5 to forwardly charge and forwardly discharge the winding to be tested to 0 A for an $N^{th}$ times, or reversely charge and reversely discharge the winding to be tested to 0 A for the $N^{th}$ times, wherein an $N^{th}$ given demagnetization current value is less than an $(N-1)^{th}$ given demagnetization current value, a reduction amount of the $N^{th}$ given demagnetization current value is 3% to 5% of the $(N-1)^{th}$ given demagnetization current value, and N is a natural number; and finish demagnetizing until the $N^{th}$ given demagnetization current value falls into an interval of 10 mA to 20 mA.

6. The device for evaluating and demagnetizing residual magnetism quantity of a power transformer according to claim 5, wherein the residual magnetism quantity demagnetization control module is further configured to collect a real-time current value i of the winding to be tested and a real-time voltage value u at two ends in the step 2 to step 6, calculate a real-time magnetic flux variation of the winding to be tested according to a formula $$\Delta\Phi = \int_{t_0}^{t_1} u\,dt,$$

and drawing a hysteresis loop with the real-time magnetic flux variation as a vertical axis and the corresponding real-time current value i as a horizontal axis.

7. A residual magnetism quantity evaluation control method of the device for evaluating and demagnetizing residual magnetism quantity of a power transformer according to claim 1, comprising the following steps:

step 1: respectively accessing two ends of a winding to be tested to two common ends between the first switch and the second switch, as well as between the third switch and the fourth switch;

step 2: switching on the first switch, the fourth switch and the main switch, switching off the second switch, the third switch, the sixth switch and the seventh switch, forwardly charging the winding to be tested, recording a real-time first current value of the winding to be tested, and finishing recording when the first current value rises to a predetermined current value;

step 3: switching on the sixth switch firstly, then switching off the first switch, the fourth switch and the main switch in sequence, and forwardly discharging the current in the winding to be tested through a discharge loop formed by a second freewheel diode, a third freewheel diode, the sixth switch and the first resistor until the current in the winding to be tested is 0 A;

step 4: switching off the sixth switch, switching on the second switch, the third switch and the main switch, reversely charging the winding to be tested, recording a real-time second current value of the winding to be tested, and finishing recording when the second current value rises to a predetermined current value;

step 5: switching on the sixth switch firstly, then switching off the second switch, the third switch and the main switch in sequence, and reversely discharging the current in the winding to be tested through a discharge loop formed by a first freewheel diode, a fourth freewheel diode, the sixth switch and the first resistor until the current in the winding to be tested is 0 A;

step 6: calculating a correlation coefficient $\rho$ of the real-time first and second current values; and step 7: evaluating $\rho'=1-\rho$, wherein $\rho'$ is a residual magnetism evaluation value, the less the $\rho'$ value is, the less the residual magnetism is, and the larger the value is, the more the residual magnetism is.

8. A residual magnetism quantity demagnetization control method of the device for evaluating and demagnetizing residual magnetism quantity of a power transformer according to claim 1, comprising the following steps:

step 1: respectively accessing two ends of the winding to be tested of the transformer to two common ends between the first switch and the second switch, as well as the third switch and the fourth switch;

step 2: switching on the first switch, the fourth switch and the main switch, switching off the second switch, the third switch, the sixth switch and the seventh switch, forwardly charging the winding to be tested, switching on the sixth switch firstly when a current value of the winding to be tested reaches a first given demagnetization current value, then switching off the first switch, the fourth switch and the main switch in sequence, and forwardly discharging until the current in the winding to be tested is 0 A;

step 3: switching off the sixth switch, switching on the second switch, the third switch and the main switch, reversely charging the winding to be tested, switching on the sixth switch firstly when the current value of the winding to be tested reaches a second given demagnetization current value, then switching off the second switch, the third switch and the main switch in sequence, and reversely discharging until the current in the winding to be tested is 0 A; wherein the second given demagnetization current value is less than the first given demagnetization current value, and a reduction amount of the second given demagnetization current value is 3% to 5% of the first given demagnetization current value;

step 4: repeating the step 2 to forwardly charge and forwardly discharge the winding to be tested to 0 A, wherein a third given demagnetization current value is less than the second given demagnetization current value, and a reduction amount of the third given demagnetization current value is 3% to 5% of the second given demagnetization current value;

step 5: repeating the step 3 to reversely charge and reversely discharge the winding to be tested to 0 A, wherein a fourth given demagnetization current value is less than the third given demagnetization current value, and a reduction amount of the fourth given demagnetization current value is 3% to 5% of the third given demagnetization current value; and step 6: repeating the steps 2 to 5 to forwardly charge and forwardly discharge the winding to be tested to 0 A for an $N^{th}$ times, or reversely charge and reversely discharge the winding to be tested to 0 A for the $N^{th}$ times, wherein an $N^{th}$ given demagnetization current value is less than an $(N-1)^{th}$ given demagnetization current value, a reduction amount of the $N^{th}$ given demagnetization current value is 3% to 5% of the $(N-1)^{th}$ given demagnetization current value, and N is a natural number; and finishing demagnetizing until the $N^{th}$ given demagnetization current value falls into an interval of 10 mA to 20 mA.

9. The residual magnetism quantity demagnetization control method of the device for evaluating and demagnetizing residual magnetism quantity of a power transformer according to claim 8, further comprising step 7 of collecting a real-time current value i of the winding to be tested and a real-time voltage value u at two ends in the step 2 to step 6, calculating a real-time magnetic flux variation of the winding to be tested according to a formula $\Delta\Phi=\int_{t_0}^{t_1} u dt$, and drawing a hysteresis loop with the real-time magnetic flux variation as a vertical axis and the corresponding real-time current value i as a horizontal axis.

10. The device for evaluating and demagnetizing residual magnetism quantity of a power transformer according to claim 2, wherein the control circuit comprises a residual magnetism quantity evaluation control module, and the residual magnetism quantity evaluation control module is configured to switch on the first switch, the fourth switch and the main switch, switch off the second switch, the third switch, the sixth switch and the seventh switch, forwardly charge a winding to be tested which is accessed to two common ends between the first switch and the second switch, as well as between the third switch and the fourth switch, record a real-time first current value of the winding to be tested, and finish recording when the first current value rises to a predetermined current value; switch on the sixth switch firstly, then switch off the first switch, the fourth switch and the main switch in sequence until the current in the winding to be tested is 0 A; switch off the sixth switch, switch on the second switch, the third switch and the main switch, reversely charge the winding to be tested, record a real-time second current value of the winding to be tested, and finish recording when the second current value rises to a predetermined current value; switch on the sixth switch firstly, then switch off the second switch, the third switch and the main switch in sequence until the current in the winding to be tested is 0 A; calculate a correlation coefficient $\rho$ of the first and second real-time current values; and evaluate $\rho'=1-\rho$, wherein $\rho'$ is a residual magnetism evaluation value, the less the $\rho'$ value is, the less the residual magnetism is, and the larger the value is, the more the residual magnetism is.

11. The device for evaluating and demagnetizing residual magnetism quantity of a power transformer according to claim 3, wherein the control circuit comprises a residual magnetism quantity evaluation control module, and the residual magnetism quantity evaluation control module is configured to switch on the first switch, the fourth switch and the main switch, switch off the second switch, the third switch, the sixth switch and the seventh switch, forwardly charge a winding to be tested which is accessed to two common ends between the first switch and the second switch, as well as between the third switch and the fourth switch, record a real-time first current value of the winding to be tested, and finish recording when the first current value rises to a predetermined current value; switch on the sixth switch firstly, then switch off the first switch, the fourth switch and the main switch in sequence until the current in the winding to be tested is 0 A; switch off the sixth switch, switch on the second switch, the third switch and the main switch, reversely charge the winding to be tested, record a real-time second current value of the winding to be tested, and finish recording when the second current value rises to a predetermined current value; switch on the sixth switch firstly, then switch off the second switch, the third switch and the main switch in sequence until the current in the winding to be tested is 0 A; calculate a correlation coefficient $\rho$ of the first and second real-time current values; and evaluate $\rho'=1-\rho$, wherein $\rho'$ is a residual magnetism evaluation value, the less the $\rho'$ value is, the less the residual magnetism is, and the larger the value is, the more the residual magnetism is.

12. The device for evaluating and demagnetizing residual magnetism quantity of a power transformer according to claim 2, wherein the control circuit comprises a residual magnetism quantity demagnetization control module, wherein the residual magnetism quantity demagnetization control module is configured to switch on the first switch, the fourth switch and the main switch, switch off the second switch, the third switch, the sixth switch and the seventh switch, forwardly charge a winding to be tested which is accessed to two common ends between the first switch and the second switch, as well as between the third switch and the fourth switch, switch on the sixth switch firstly when a current value of the winding to be tested reaches a first given demagnetization current value, then switch off the first switch, the fourth switch and the main switch in sequence, and forwardly discharge until the current in the winding to be tested is 0 A; switch off the sixth switch, switch on the second switch, the third switch and the main switch, reversely charge the winding to be tested, switch on the sixth switch firstly when the current value of the winding to be tested reaches a second given demagnetization current value, then switch off the second switch, the third switch and the main switch in sequence, and reversely discharge until the current in the winding to be tested is 0 A, wherein the second given demagnetization current value is less than the first given demagnetization current value, and a reduction amount of the second given demagnetization current value is 3% to 5% of the first given demagnetization current value; repeat the step 2 to forwardly charge and forwardly discharge the winding to be tested to 0 A, wherein a third given demagnetization current value is less than the second given demagnetization current value, and a reduction amount of the third given demagnetization current value is 3% to 5% of the second given demagnetization current value; repeat the step 3 to reversely charge and reversely discharge the winding to be tested to 0 A, wherein a fourth given demagnetization current value is less than the third given demagnetization current value, and a reduction amount of the fourth given demagnetization current value is 3% to 5% of the third given demagnetization current value; repeat the steps 2 to 5 to forwardly charge and forwardly discharge the winding to be tested to 0 A for an $N^{th}$ times, or reversely charge and reversely discharge the winding to be tested to 0 A for the $N^{th}$ times, wherein an $N^{th}$ given demagnetization current value is less than an $(N-1)^{th}$ given demagnetization current value, a reduction amount of the $N^{th}$ given demagnetization current value is 3% to 5% of the $(N-1)^{th}$ given demagnetization current value, and N is a natural number; and finish demagnetizing until the $N^{th}$ given demagnetization current value falls into an interval of 10 mA to 20 mA.

13. The device for evaluating and demagnetizing residual magnetism quantity of a power transformer according to claim 3, wherein the control circuit comprises a residual magnetism quantity demagnetization control module, wherein the residual magnetism quantity demagnetization control module is configured to switch on the first switch, the fourth switch and the main switch, switch off the second switch, the third switch, the sixth switch and the seventh switch, forwardly charge a winding to be tested which is accessed to two common ends between the first switch and the second switch, as well as between the third switch and the fourth switch, switch on the sixth switch firstly when a current value of the winding to be tested reaches a first given demagnetization current value, then switch off the first switch, the fourth switch and the main switch in sequence, and forwardly discharge until the current in the winding to be tested is 0 A; switch off the sixth switch, switch on the second switch, the third switch and the main switch, reversely charge the winding to be tested, switch on the sixth switch firstly when the current value of the winding to be tested reaches a second given demagnetization current value, then switch off the second switch, the third switch and the main switch in sequence, and reversely discharge until the current in the winding to be tested is 0 A, wherein the second given demagnetization current value is less than the first given demagnetization current value, and a reduction amount of the second given demagnetization current value is 3% to 5% of the first given demagnetization current value; repeat the step 2 to forwardly charge and forwardly discharge the winding to be tested to 0 A, wherein a third given demagnetization current value is less than the second given demagnetization current value, and a reduction amount of the third given demagnetization current value is 3% to 5% of the second given demagnetization current value; repeat the step 3 to reversely charge and reversely discharge the winding to be tested to 0 A, wherein a fourth given demagnetization current value is less than the third given demagnetization current value, and a reduction amount of the fourth given demagnetization current value is 3% to 5% of the third given demagnetization current value; repeat the steps 2 to 5 to forwardly charge and forwardly discharge the winding to be tested to 0 A for an $N^{th}$ times, or reversely charge and reversely discharge the winding to be tested to 0 A for the $N^{th}$ times, wherein an $N^{th}$ given demagnetization current value is less than an $(N-1)^{th}$ given demagnetization current value, a reduction amount of the $N^{th}$ given demagnetization current value is 3% to 5% of the $(N-1)^{th}$ given demagnetization current value, and N is a natural number;

and finish demagnetizing until the $N^{th}$ given demagnetization current value falls into an interval of 10 mA to 20 mA.

14. A residual magnetism quantity evaluation control method of the device for evaluating and demagnetizing residual magnetism quantity of a power transformer according to claim 2, comprising the following steps:
   step 1: respectively accessing two ends of a winding to be tested of the transformer to two common ends between the first switch and the second switch, as well as between the third switch and the fourth switch;
   step 2: switching on the first switch, the fourth switch and the main switch, switching off the second switch, the third switch, the sixth switch and the seventh switch, forwardly charging the winding to be tested, recording a real-time first current value of the winding to be tested, and finishing recording when the first current value rises to a predetermined current value;
   step 3: switching on the sixth switch firstly, then switching off the first switch, the fourth switch and the main switch in sequence, and forwardly discharging the current in the winding to be tested through a discharge loop formed by a second freewheel diode, a third freewheel diode, the sixth switch and the first resistor until the current in the winding to be tested is 0 A;
   step 4: switching off the sixth switch, switching on the second switch, the third switch and the main switch, reversely charging the winding to be tested, recording a real-time second current value of the winding to be tested, and finishing recording when the second current value rises to a predetermined current value;
   step 5: switching on the sixth switch firstly, then switching off the second switch, the third switch and the main switch in sequence, and reversely discharging the current in the winding to be tested through a discharge loop formed by a first freewheel diode, a fourth freewheel diode, the sixth switch and the first resistor until the current in the winding to be tested is 0 A;
   step 6: calculating a correlation coefficient $\rho$ of the real-time first and second current values; and
   step 7: evaluating $\rho'=1-\rho$, wherein $\rho'$ is a residual magnetism evaluation value, the less the $\rho'$ value is, the less the residual magnetism is, and the larger the value is, the more the residual magnetism is.

15. A residual magnetism quantity evaluation control method of the device for evaluating and demagnetizing residual magnetism quantity of a power transformer according to claim 3, comprising the following steps:
   step 1: respectively accessing two ends of a winding to be tested of the transformer to two common ends between the first switch and the second switch, as well as between the third switch and the fourth switch;
   step 2: switching on the first switch, the fourth switch and the main switch, switching off the second switch, the third switch, the sixth switch and the seventh switch, forwardly charging the winding to be tested, recording a real-time first current value of the winding to be tested, and finishing recording when the first current value rises to a predetermined current value;
   step 3: switching on the sixth switch firstly, then switching off the first switch, the fourth switch and the main switch in sequence, and forwardly discharging the current in the winding to be tested through a discharge loop formed by a second freewheel diode, a third freewheel diode, the sixth switch and the first resistor until the current in the winding to be tested is 0 A;
   step 4: switching off the sixth switch, switching on the second switch, the third switch and the main switch, reversely charging the winding to be tested, recording a real-time second current value of the winding to be tested, and finishing recording when the second current value rises to a predetermined current value;
   step 5: switching on the sixth switch firstly, then switching off the second switch, the third switch and the main switch in sequence, and reversely discharging the current in the winding to be tested through a discharge loop formed by a first freewheel diode, a fourth freewheel diode, the sixth switch and the first resistor until the current in the winding to be tested is 0 A;
   step 6: calculating a correlation coefficient $\rho$ of the real-time first and second current values; and
   step 7: evaluating $\rho'=1-\rho$, wherein $\rho'$ is a residual magnetism evaluation value, the less the $\rho'$ value is, the less the residual magnetism is, and the larger the value is, the more the residual magnetism is.

16. A residual magnetism quantity demagnetization control method of the device for evaluating and demagnetizing residual magnetism quantity of a power transformer according to claim 2, comprising the following steps:
   step 1: respectively accessing two ends of the winding to be tested of the transformer to two common ends between the first switch and the second switch, as well as the third switch and the fourth switch;
   step 2: switching on the first switch, the fourth switch and the main switch, switching off the second switch, the third switch, the sixth switch and the seventh switch, forwardly charging the winding to be tested, switching on the sixth switch firstly when a current value of the winding to be tested reaches a first given demagnetization current value, then switching off the first switch, the fourth switch and the main switch in sequence, and forwardly discharging until the current in the winding to be tested is 0 A;
   step 3: switching off the sixth switch, switching on the second switch, the third switch and the main switch, reversely charging the winding to be tested, switching on the sixth switch firstly when the current value of the winding to be tested reaches a second given demagnetization current value, then switching off the second switch, the third switch and the main switch in sequence, and reversely discharging until the current in the winding to be tested is 0 A; wherein the second given demagnetization current value is less than the first given demagnetization current value, and a reduction amount of the second given demagnetization current value is 3% to 5% of the first given demagnetization current value;
   step 4: repeating the step 2 to forwardly charge and forwardly discharge the winding to be tested to 0 A, wherein a third given demagnetization current value is less than the second given demagnetization current value, and a reduction amount of the third given demagnetization current value is 3% to 5% of the second given demagnetization current value;
   step 5: repeating the step 3 to reversely charge and reversely discharge the winding to be tested to 0 A, wherein a fourth given demagnetization current value is less than the third given demagnetization current value, and a reduction amount of the fourth given demagnetization current value is 3% to 5% of the third given demagnetization current value; and
   step 6: repeating the steps 2 to 5 to forwardly charge and forwardly discharge the winding to be tested to 0 A for an $N^{th}$ times, or reversely charge and reversely discharge the winding to be tested to 0 A for the $N^{th}$ times, wherein an $N^{th}$ given demagnetization current value is less than an $(N-1)^{th}$ given demagnetization current value, a reduction amount of the $N^{th}$ given demagnetization current value is 3% to 5% of the $(N-1)^{th}$ given demagnetization current value, and N is a natural number; and finishing demagnetizing until the $N^{th}$ given demagnetization current value falls into an interval of 10 mA to 20 mA.

17. The residual magnetism quantity demagnetization control method of the device for evaluating and demagnetizing residual magnetism quantity of a power transformer according to claim 16, further comprising step 7 of collecting a real-time current value i of the winding to be tested and a real-time voltage value u at two ends in the step 2 to step 6, calculating a real-time magnetic flux variation of the winding to be tested according to a formula $\Delta\Phi=\int_{t_0}^{t_1}udt$, and drawing a hysteresis loop with the real-time magnetic flux variation as a vertical axis and the corresponding real-time current value i as a horizontal axis.

18. A residual magnetism quantity demagnetization control method of the device for evaluating and demagnetizing residual magnetism quantity of a power transformer according to claim 3, comprising the following steps:

step 1: respectively accessing two ends of the winding to be tested of the transformer to two common ends between the first switch and the second switch, as well as the third switch and the fourth switch;

step 2: switching on the first switch, the fourth switch and the main switch, switching off the second switch, the third switch, the sixth switch and the seventh switch, forwardly charging the winding to be tested, switching on the sixth switch firstly when a current value of the winding to be tested reaches a first given demagnetization current value, then switching off the first switch, the fourth switch and the main switch in sequence, and forwardly discharging until the current in the winding to be tested is 0 A;

step 3: switching off the sixth switch, switching on the second switch, the third switch and the main switch, reversely charging the winding to be tested, switching on the sixth switch firstly when the current value of the winding to be tested reaches a second given demagnetization current value, then switching off the second switch, the third switch and the main switch in sequence, and reversely discharging until the current in the winding to be tested is 0 A; wherein the second given demagnetization current value is less than the first given demagnetization current value, and a reduction amount of the second given demagnetization current value is 3% to 5% of the first given demagnetization current value;

step 4: repeating the step 2 to forwardly charge and forwardly discharge the winding to be tested to 0 A, wherein a third given demagnetization current value is less than the second given demagnetization current value, and a reduction amount of the third given demagnetization current value is 3% to 5% of the second given demagnetization current value;

step 5: repeating the step 3 to reversely charge and reversely discharge the winding to be tested to 0 A, wherein a fourth given demagnetization current value is less than the third given demagnetization current value, and a reduction amount of the fourth given demagnetization current value is 3% to 5% of the third given demagnetization current value; and step 6: repeating the steps 2 to 5 to forwardly charge and forwardly discharge the winding to be tested to 0 A for an $N^{th}$ times, or reversely charge and reversely discharge the winding to be tested to 0 A for the $N^{th}$ times, wherein an $N^{th}$ given demagnetization current value is less than an $(N-1)^{th}$ given demagnetization current value, a reduction amount of the $N^{th}$ given demagnetization current value is 3% to 5% of the $(N-1)^{th}$ given demagnetization current value, and N is a natural number; and finishing demagnetizing until the $N^{th}$ given demagnetization current value falls into an interval of 10 mA to 20 mA.

19. The residual magnetism quantity demagnetization control method of the device for evaluating and demagnetizing residual magnetism quantity of a power transformer according to claim 18, further comprising step 7 of collecting a real-time current value i of the winding to be tested and a real-time voltage value u at two ends in the step 2 to step 6, calculating a real-time magnetic flux variation of the winding to be tested according to a formula $\Delta\Phi=\int_{t_0}^{t_1}udt$, and drawing a hysteresis loop with the real-time magnetic flux variation as a vertical axis and the corresponding real-time current value i as a horizontal axis.

* * * * *